United States Patent
Wu et al.

(10) Patent No.: US 8,009,482 B2
(45) Date of Patent: *Aug. 30, 2011

(54) HIGH TEMPERATURE METHODS FOR ENHANCING RETENTION CHARACTERISTICS OF MEMORY DEVICES

(75) Inventors: Chao-I Wu, Zhubei (TW); Tzu Hsuan Hsu, Jhongpu Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/911,264

(22) Filed: Oct. 25, 2010

(65) Prior Publication Data

US 2011/0032770 A1 Feb. 10, 2011

Related U.S. Application Data

(63) Continuation of application No. 11/741,053, filed on Apr. 27, 2007, now Pat. No. 7,839,695.

(51) Int. Cl.
*G11C 11/34* (2006.01)
(52) U.S. Cl. ......... 365/185.24; 365/185.02; 365/185.28; 365/201
(58) Field of Classification Search .............. 365/185.02, 365/185.24, 185.28, 201
See application file for complete search history.

(56) References Cited

U.S. PATENT DOCUMENTS

| | | | |
|---|---|---|---|
| 5,268,320 A * | 12/1993 | Holler et al. | 438/591 |
| 6,075,724 A | 6/2000 | Li et al. | |
| 6,344,994 B1 | 2/2002 | Hamilton et al. | |
| 6,618,290 B1 | 9/2003 | Wang et al. | |
| 6,778,442 B1 | 8/2004 | Hamilton et al. | |
| 6,813,752 B1 | 11/2004 | Hsia et al. | |
| 6,993,690 B1 | 1/2006 | Okamoto | |
| 7,259,995 B2 | 8/2007 | Shih et al. | |
| 7,839,695 B2 | 11/2010 | Wu et al. | |
| 2007/0263444 A1 | 11/2007 | Gorobets et al. | |

OTHER PUBLICATIONS

Janai, Meir et al., "Data Retention Reliability Model of NROM Nonvolatile Memory Products," IEEE Transactions on Device and MaterialsReiliability vol. 4, No. 3, Sep. 2004, 12 pages.

* cited by examiner

*Primary Examiner* — Dang T Nguyen
*Assistant Examiner* — Alexander Sofocleous
(74) *Attorney, Agent, or Firm* — Kenta Suzue Haynes Beffel & Wolfeld LLP

(57) ABSTRACT

Methods are described for improving the retention of a memory device by execution of a retention improvement procedure. The retention improvement procedure comprises a baking process of the memory device in a high temperature environment, a verifying process of the memory device that checks the logic state of memory cells, and a reprogramming process to program the memory device once again by programming memory cells in a 0-state to a high-Vt state. The baking step of placing the memory device in a high temperature environment causes a charge loss by expelling shallow trapped charges, resulting in the improvement of retention reliability.

9 Claims, 9 Drawing Sheets 150 baking charge loss (mV)

| | PgmVt=3V | PgmVt=6V | PgmVt=9V |
|---|---|---|---|
| 150bake5min | 0 | -50 | -85 |
| 150bake10min | 0 | -58 | -105 |
| 150bake20min | 0 | -70 | -136 |
| 150bake40min | 0 | -76 | -152 |
| 150bake80min | 0 | -78 | -186 |
| 150bake160min | 0 | -84 | -205 |
| 150bake320min | 0 | -84 | -244 |
| 150bake640min | 0 | -92 | -320 |

Fig. 5B
*(Prior Art)*

150 baking charge loss (mV)

| Program voltage threshold Vt | Program Vt = 2.956496 | Program Vt = 6.090053 | Program Vt = 9.095809 |
|---|---|---|---|
| 250bake6min | | | |
| recovy pgm | | | |
| 150bake5min | 0 | 0 | -16 |
| 150bake15min | 0 | 0 | -18 |
| 150bake35min | 0 | 0 | -19 |
| 150bake75min | 0 | 0 | -28 |
| 150bake155min | 0 | 0 | -59 |
| 150bake315min | 0 | 0 | -77 |
| 150bake635min | 0 | 0 | -94 |

Fig. 7B

HIGH TEMPERATURE METHODS FOR ENHANCING RETENTION CHARACTERISTICS OF MEMORY DEVICES

RELATED APPLICATIONS

This application is a continuation of U.S. application Ser. No. 11/741,053, filed on 27 Apr. 2007, entitled High Temperature Methods for Enhancing Retention Characteristics of Memory Devices by inventors Chao-I Wu and Tzu Hsuan Hsu. This application is incorporated herein by reference.

BACKGROUND OF THE INVENTION

1. Field of the Invention

The present invention relates generally to electrically programmable and erasable memory, and more particularly, to improving the retention characteristics of cycled and uncycled cells in memory devices.

2. Description of Related Art

Electrically programmable and erasable nonvolatile memory technologies based on charge storage structures, known as Electrically Erasable Programmable Read-Only Memory (EEPROM) and flash memory, are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names Nitride Read-Only Memory, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Nitride read-only memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a nitride read-only memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

In a typical flash memory cell structure a tunnel oxide layer is positioned between a conducting polysilicon tunnel oxide layer and a crystalline silicon semiconductor substrate. The term "substrate" refers to a source region and a drain region separated by an underlying channel region. A flash memory read can be executed by a drain sensing or a source sensing. For source side sensing, one or more source lines are coupled to source regions of memory cells for reading current from a particular memory cell in a memory array.

A traditional floating gate device stores 1 bit of charge in a conductive floating gate. In nitride read-only memory cells each nitride read-only memory cell provides 2 bits of flash cells that store charge in an Oxide-Nitride-Oxide (ONO) dielectric. In a typical nitride read-only memory cell structure, a nitride layer is used as a trapping material positioned between a top oxide layer and a bottom oxide layer. The ONO layer structure effectively replaces the gate dielectric in floating gate devices. The charge in the ONO dielectric with a nitrite layer may be either trapped on the left side or the right side of a nitride read-only memory cell.

A frequently used technique to program nitride read-only memory cells in a nitride read-only memory array is the hot electron injection method. During an erase operation, a common technique used to erase memory cells is called band-to-band tunneling hot hole injection where the eraseability is highly dependent on the lateral electric field. The other side potential, from the side that is being erased, of a nitride read-only memory cell is likely to have a lateral electric field effect on the eraseability. Evaluating the endurance and retention of a nitride read-only memory array, the lack of uniformity in eraseability causes a margin loss due to cycling and baking. The other side of nitride read-only memory cells is left floating (or connected to ground) and may be coupled to an uncertain voltage level (e.g. 1 volt or 4 volts), which causes variation of the erase threshold of array cells. This in turn causes Vt distribution after an erase operation to be wider.

A nitride read-only memory type of device typically undergoes a series of program and erase cycles which cause electrons to migrate closer to the middle of a channel region. In a subsequent erase operation using a technique such as BTBTHH, it would be difficult to move holes toward the middle of the channel region which would leave residual electrons near the channel region which would be hard to erase. The hard-to-erase scenario typically occurs in a multi-bit cell like nitride read-only memory with localized hot electron and hot hole injection program and erase schemes.

Memory devices that have defective cells are detected during manufacturing to screen them out by conducting cycling operations on the entire cells on a memory device. A negative consequence of the screening procedure is the degradation of the retention characteristics after cycling operations. Accordingly, it is desirable to provide a method that provides quality retention characteristics even after the cycling operations have been conducted on memory devices.

SUMMARY OF THE INVENTION

The present disclosure describes methods for improving the retention of a memory device by execution of a retention improvement procedure (RIP). The retention improvement procedure comprises a baking process of the memory device in a high temperature environment, a verifying process of the memory device that checks the logic state of memory cells, and a reprogramming process to program the memory device once again by programming memory cells in 0-state to high-Vt state. The baking step of placing the memory device in a high temperature environment causes a charge loss by expelling shallow trapped charges, resulting in the improvement of retention reliability.

In a first embodiment, the retention improvement procedure is applied to uncycled memory cells in the memory device. In this embodiment, the memory device is programmed for all memory cells in 0-state to high-Vt state by writing data into the memory device. The next sequence places the memory device in the retention improvement procedure until the memory device passes the verifying process. An optional step inserts a designation for the number of times to retry the reprogramming process before exiting the retention improvement procedure because a particular memory device may be defective to the extent that it is unlikely to pass the retention improvement procedure.

In a second embodiment, the retention improvement procedure is applied to cycled memory cells in the memory device. In this embodiment, the memory device undergoes program and erase cycles (also referring to as "cycled memory cells") to screen out defective memory cells in the memory device. The number of defective memory cells detected is excluded from the batch of memory devices. The memory devices that are found not to be defective are then programmed by programming memory cells that are in 0-state to high-Vt state. At this point, the memory devices are run through the retention improvement procedure as described above to improve their retention reliability.

Broadly stated, a method for improving retention characteristics of a memory device including a plurality of memory cells, comprises baking the plurality of memory cells at a temperature level for a sufficient duration to cause shallow trapped charges to be expelled from the plurality of memory cells; verifying the plurality of memory cells to determine if written data in memory cells are still the same; and if the plurality of memory cells do not pass the verify step, reprogramming the plurality of 0-state memory cells to the high voltage threshold Vt state again.

Advantageously, the present invention provides methods for improving the retention characteristics of uncycled and cycled memory cells in memory devices.

The structures and methods of the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

The invention will be described with respect to specific embodiments thereof, and reference will be made to the drawings, in which:

FIG. 5B is a prior art table illustrating sample data for baking charge loss of the memory device that is baked at 150° C. with medium and high voltage threshold Vt states.

FIG. 7B is a table illustrating sample data for baking charge loss of the memory device that is baked at 150° C. with medium and high voltage threshold Vt states in accordance with the present invention.

DETAILED DESCRIPTION

Figure 1:
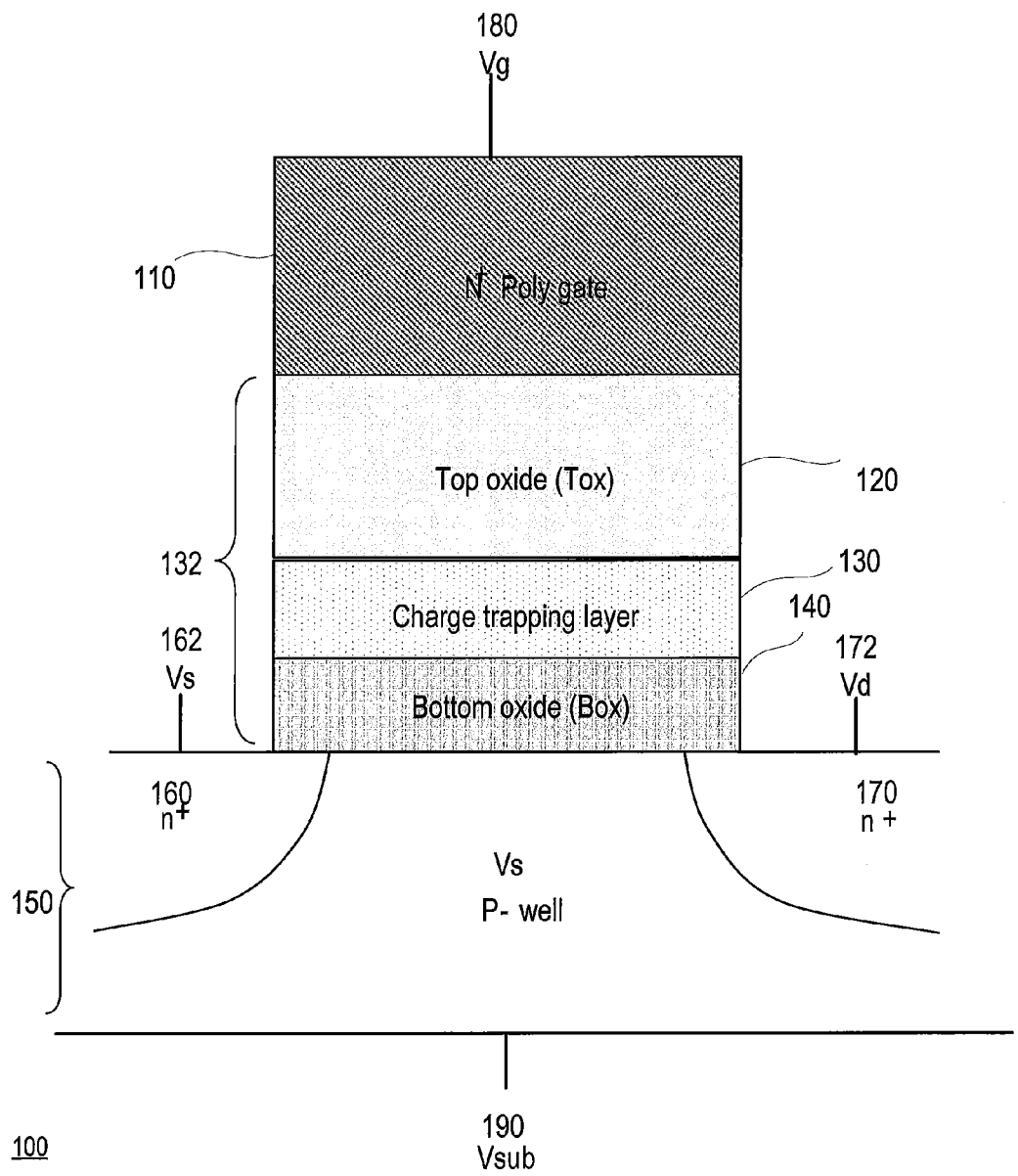
FIG. 1 is a simplified structural diagram illustrating an exemplary charge trapping memory in accordance with the present invention.

A description of structural embodiments and methods of the present invention is provided with reference to FIGS. 1-7B. It is to be understood that there is no intention to limit the invention to the specifically disclosed embodiments but that the invention may be practiced using other features, elements, methods and embodiments. Like elements in various embodiments are commonly referred to with like reference numerals.

Referring now to FIG. 1, there is shown a simplified structural diagram illustrating an exemplary charge trapping memory 100. The charge trapping memory cell 100 has a substrate 150 with n+ doped regions 160 and 170, and a p-doped region 152 between the n+ doped regions 160 and 170. A bottom dielectric structure 140 (bottom oxide) overlays the substrate 150, a charge trapping layer 130 (e.g. silicon nitride layer) overlays the bottom dielectric structure 140, and a top dielectric structure (top oxide) 120 overlays the charge trapping layer 130, and a N+ poly gate 110 overlays the top dielectric structure 120. The combination of the top oxide 120, the charge trapping layer 130 and the bottom oxide 140 are often referred to as a charge trapping structure 132 or an ONO (oxide-nitride-oxide) structure. A gate voltage 180, Vg, is connected to the n+ poly gate 110, and a substrate voltage 190, Vsub, is connected to the P-well substrate 150. A source voltage 1162, Vs, is connected to the n+ doped region 160, and a drain voltage 172, Vd, is connected to the n-doped region 170.

The charge trapping structure 132 in the charge trapping memory cell 100 is intended as an illustration. Other combinations of charge trapping structures, such as metal-oxide-nitride-oxide semiconductor (MNOS), or silicon-nitride-oxide-semiconductor (SNOS), or oxide-nitride-oxide-nitride-oxide (ONONO) stacks, or other variations of a charge trapping structure can be practiced without departing from the spirit of the present invention.

Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, $CeO_2$, and others. The charge trapping structure may be a discontinuous set of pockets or particles of charge trapping material, or a continuous layer as shown in the drawing.

The memory cell like a nitride read-only memory cell or a dielectric charge trapping memory cell has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

Figure 2:
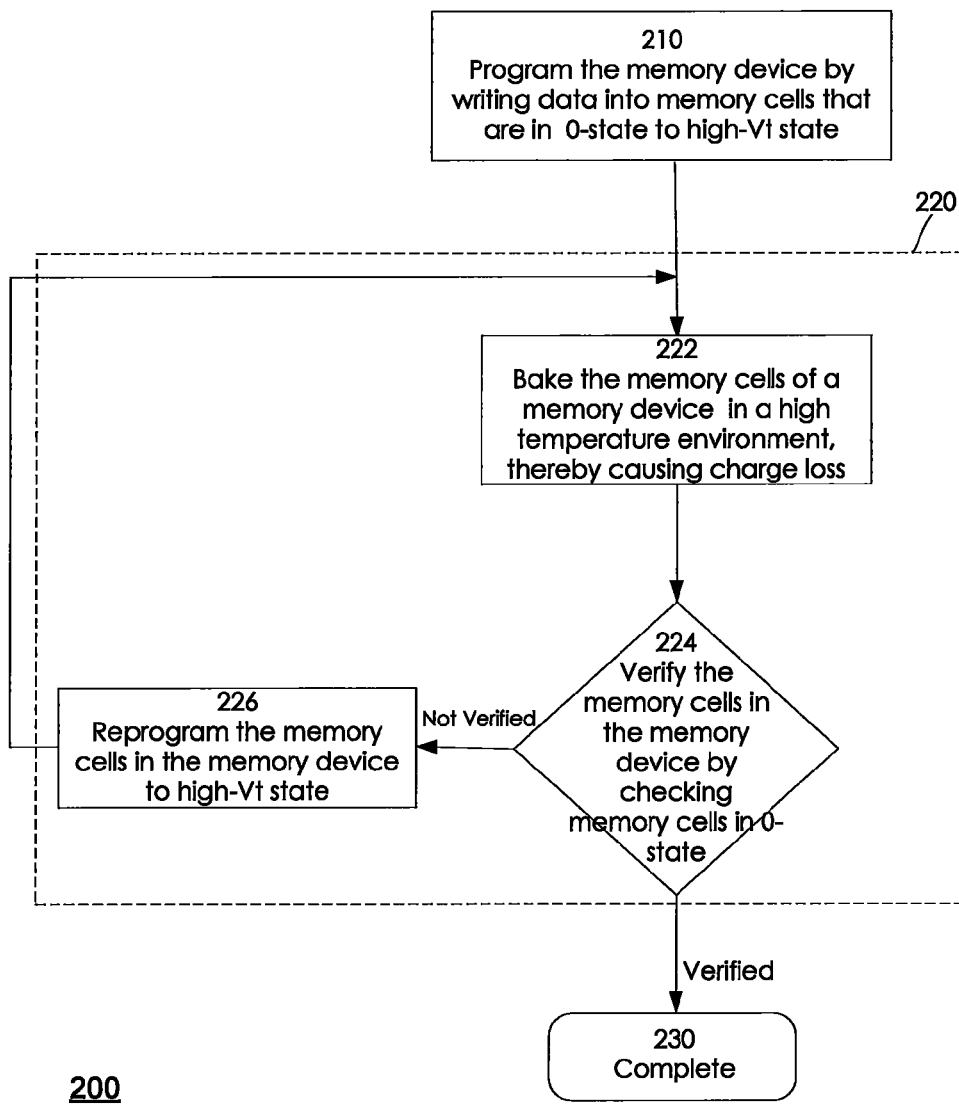
FIG. 2 is a flow diagram illustrating a first embodiment of a retention improvement procedure for one-time-program (OTP) memory cells in accordance with the present invention.

FIG. 2 is a flow diagram 200 illustrating a first embodiment of a retention improvement procedure (RIP) for one-time-program (OTP, or uncycled) of memory cells in memory device 100 to expel memory cells that have shallow trapped charges. At step 210, all 0-state data (high-Vt data) will be written into memory cells by programming method. All 1-state data (low-Vt state) will not be programmed.

The retention improvement procedure 220 comprises a baking process at step 222, a verify process at step 224 and a reprogram process at step 226. At step 222, the memory device 100 is baked in a high temperature environment causing a charge loss in the memory device 100. The high temperature environment causes shallow trapped charges to be expelled in the memory device 100, thereby improving retention reliability. Shallow trapped charge will be expelled under high temperature environment. As the result, deeper trapped charges are retained. Deeper trapped charges produce better retention performance.) The term "high temperature" refers to a temperature that is higher than a room temperature. In one embodiment, the memory device 100 is baked at 150° C. In another embodiment, the memory device 100 is baked at 250° C.

At step 224, the memory device 100 undergoes a verification process to check whether each of the memory cells is either in a logic 0-state (a high state) or a logic 1-state (a low state). A read operation is conducted to determine if each of the memory cells is in a 0-state or a 1-state. The voltage setting for a read operation is typically selected between a program state (program voltage threshold) and an erase voltage (erase voltage threshold). For example, a program state can be set at 4 volts, an erase state can be set at 2 volts, and a read state can be set at 3 volts. A compare operation is then conducted to verify the read data against pre-written data to determine whether the read data passes the verification process. The comparison step is a read step for confirming all pre-written data is still high Vt state without charge loss.

If the uncycled memory cells do not pass the verify step, the process continues at step 226. At step 226, the memory device is reprogrammed for un-passed high-Vt state memory cells to high voltage threshold Vt state again. Data is written into memory cells in the memory device 100 once again. The retention improvement procedure 220 continues by looping through the baking process at step 222, the verify process at step 224 and a reprogram process at step 226 until the memory device 100 passes the verify process at step 224. When the memory device 100 passes the verify process at step 224, the process 200 exits to step 230.

Figure 3:
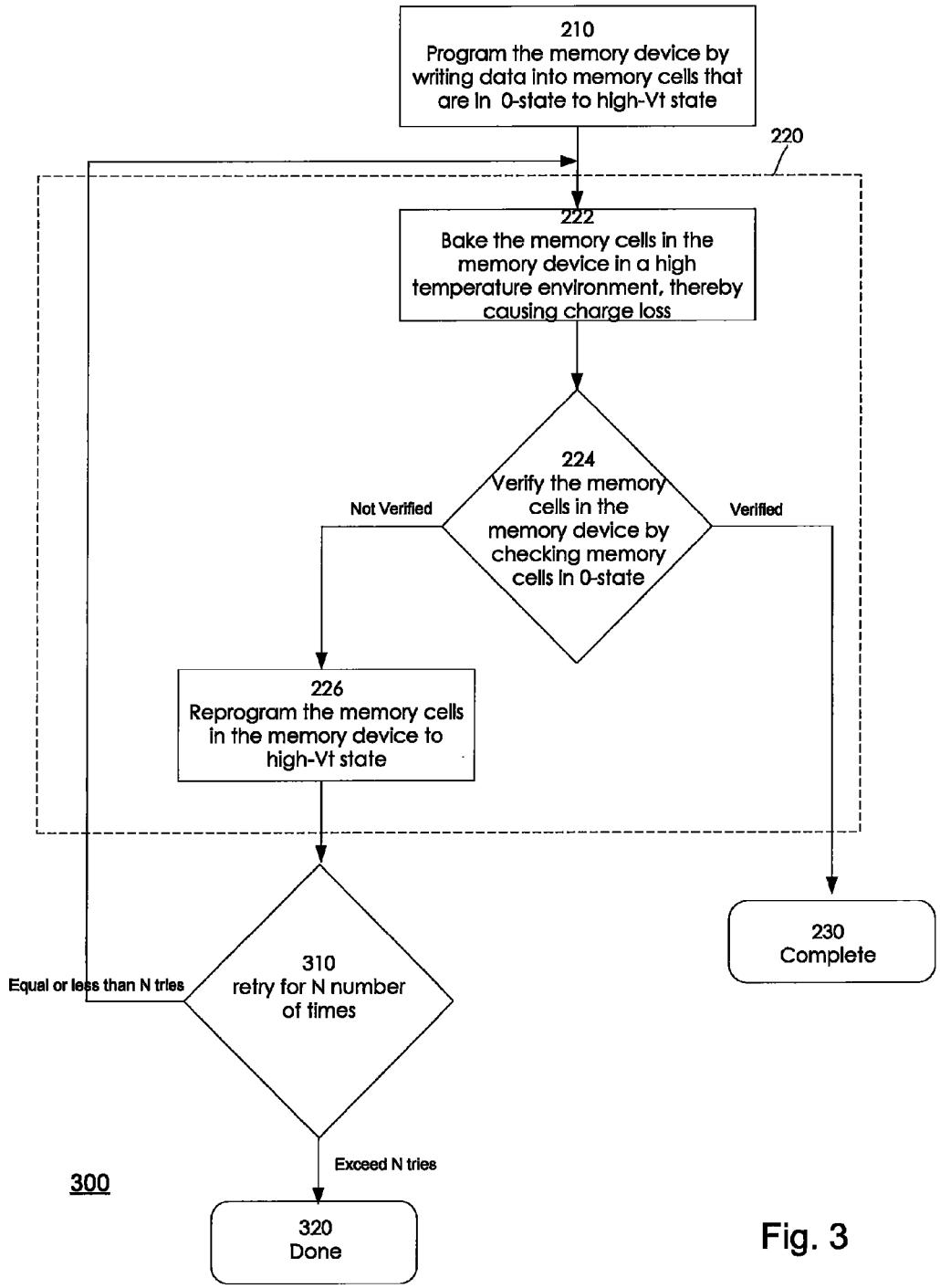
FIG. 3 is a flow diagram illustrating an optional step in the first embodiment of a retention improvement procedure for memory cells in accordance with the present invention.

FIG. 3 is a flow diagram illustrating the process 300 with the addition of an optional retry mechanism in the first embodiment of the retention improvement procedure for uncycled memory cells. The optional step 310 has been added, after the reprogram step 226, to retry for N number of times for reprogramming the memory device. If the number of times for reprogramming has not been exceeded, either equal to or less than N number of times, the process 300 returns to the high temperature baking at step 222. However, if the number of times for reprogramming has been exceeded, the process 300 exits at step 320. Other variations and modifications of the process 300 can be practiced without departing from the spirit of the present invention, for example such as placing the retry step 310 before the reprogram step 226.

Figure 4:
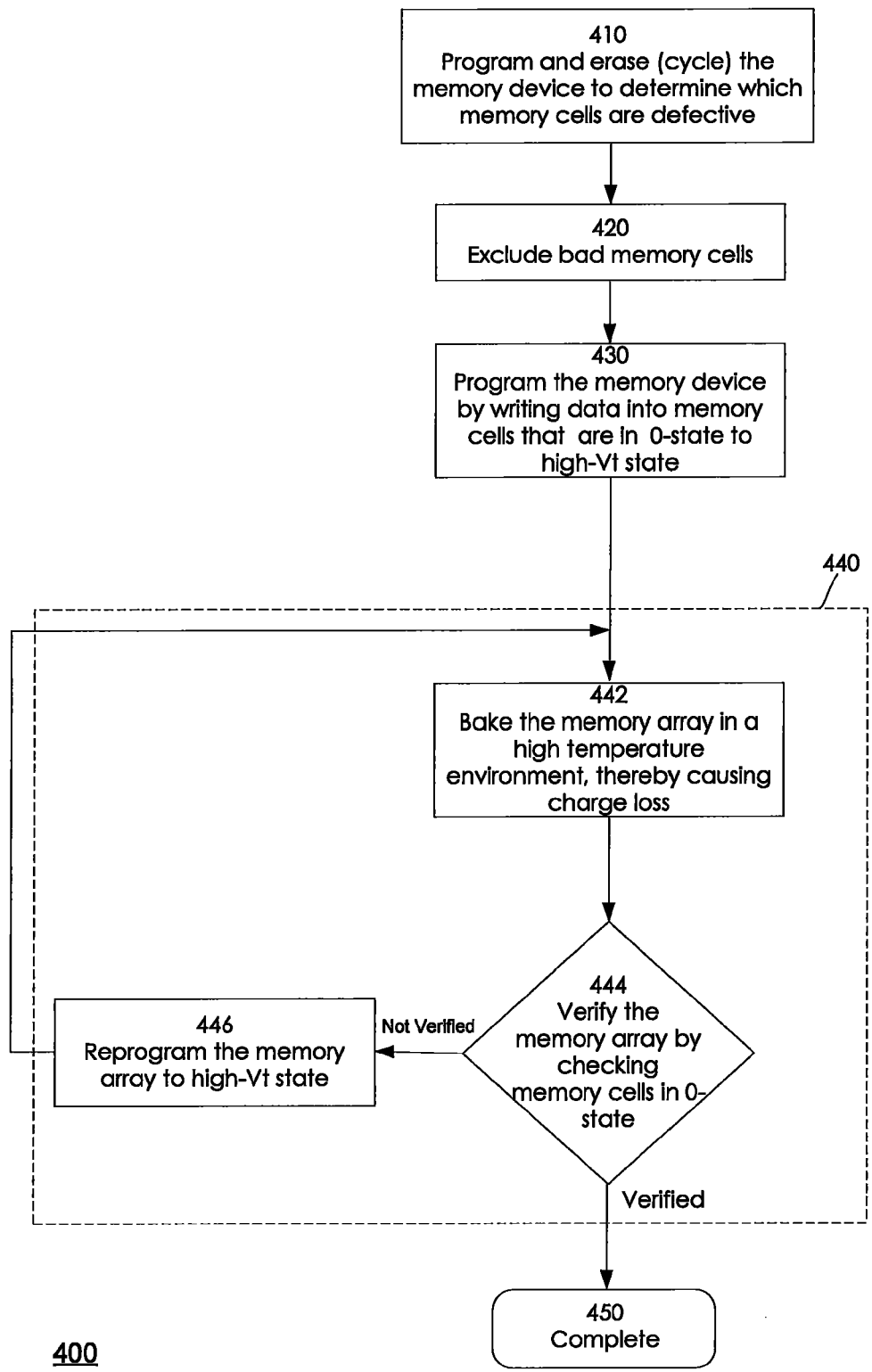
FIG. 4 is a flow diagram illustrating a second embodiment of a retention improvement procedure for cycled memory cells in accordance with the present invention.

FIG. 4 illustrates a flow diagram 400 of a second embodiment of a retention improvement procedure for cycled memory cells in the memory device 100 to expel memory cells that have shallow trapped charges. At step 410, the memory device 100 undergoes program and erase cycles to determine which memory cells in the memory device 100 are defective in order to screen out defective memory cells. At step 420, the defective memory cells detected at step 410 are excluded so that the memory device 100 provides memory cells that are operational, for example, such that 100% of the remaining memory cells in the memory device 100 are usable. At step 430, all 0-state data is wrote into memory cells in the memory device 100 by programming method. The retention improvement procedure 440 comprises the following: a baking process at step 422, a verify process at step 424 and a reprogram process at step 426.

At step 442, the memory device 100 is baked in a high temperature environment so as to cause a charge loss in the memory device 100. The high temperature environment causes shallow trapped charges to be expelled in the memory device 100. The term "high temperature" refers to a temperature that is higher than room temperature. In one embodiment, the memory device 100 is baked at 150° C. In another embodiment, the memory device 100 is baked at 250° C.

At step 444, the memory device 100 undergoes a verify process to check whether each of the memory cells is in a 0-state or a 1-state. A read operation is conducted to determine if each of the memory cells is in a 0-state or a 1-state. The voltage setting for a read operation is typically selected between a program state (program voltage threshold) and an erase voltage (erase voltage threshold). For example, a program state can be set at 4 volts, an erase state can be set at 2 volts, and a read state can be set at 3 volts. A compare operation is then conducted to verify the read data against pre-written data to determine whether the read data passes the verification process. The comparison step is a read step for confirming all pre-written data is still the same with charge loss.

If the uncycled memory cells do not pass the verify step, the process continues at step 446. At step 446, the memory device 100 is reprogrammed to high voltage threshold Vt state again. The retention improvement procedure 440 continues by looping through the baking process at step 442, the verify process at step 444 and the reprogram process at step 446 until the memory device 100 passes the verify process at step 444. When the memory device 100 passes the verify process at step 444, the process 400 exits at step 450.

Similar to an optional step in the first embodiment, an optional step can also been added, after (or before) the reprogram step 446, to retry for N number of times for reprogramming the memory device 100. If the number of attempts at reprogramming has not been exceeded, either equal to or less than N number of times, the process 400 returns to the high temperature baking at step 442. However, if the number of attempts at reprogramming has been exceeded, the process 400 exits the loop.

Figure 5A:
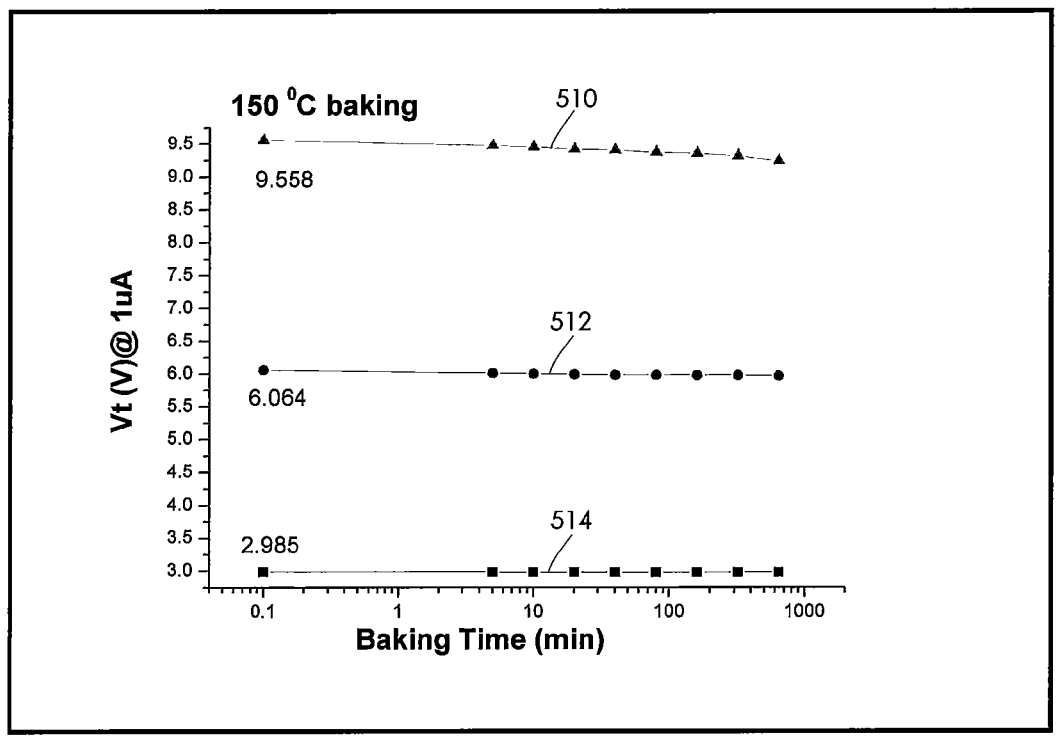
FIG. 5A is a prior art graph illustrating retention data at 150° C. without the retention improvement procedure for medium and high voltage threshold states.

FIG. 5A is a graph 500 illustrating the retention data at 150° C. without the retention improvement procedure for medium and high voltage threshold states. The graph 500 depicts three sample data lines 510, 512 and 514 in which the memory device 100 is baked at 150° C. The data line 510 represents a series of data points in which the program voltage threshold Vt is about 9 volts. The baking charge losses in the data line 510 gradually increase as a function of time. Sample charge loss data of the memory device 100 that is baked at 150° C. with medium and high voltage threshold Vt states without the retention improvement procedure are shown in FIG. 5B.

As shown in a column 520, the charge loss for the program voltage threshold Vt of about 9 volts is about −85 millivolts for baking about 5 minutes at 150° C., about −105 millivolts for baking about 10 minutes at 150° C., about −136 millivolts for baking about 20 minutes at 150° C., about −152 millivolts for baking about 75 minutes at 150° C., about −152 millivolts for baking about 40 minutes at 150° C., about −186 millivolts for baking about 80 minutes at 150° C., about −205 millivolts for baking about 160 minutes at 150° C., about −244 millivolts for baking about 320 minutes at 150° C., and about −320 millivolts for baking about 640 minutes at 150° C. The amount of charge losses without the retention improvement procedure as shown in column 520 is significantly larger than if the amount of charge losses generated with the retention improvement procedure.

The data line 512 represents a series of data points in which the program voltage threshold Vt is about 6 volts. Sample data results of baking charge loss of the memory device 100 that is baked at 150° C. with medium and high voltage threshold Vt states are shown in FIG. 5B. As shown in a column 522, the charge loss for the program voltage threshold Vt of about 6 volts is about −50 millivolts for baking about 5 minutes at 150° C., about −58 millivolts for baking about 10 minutes at 150° C., about −70 millivolts for baking about 20 minutes at 150° C., about −76 millivolts for baking about 40 minutes at 150° C., about −78 millivolts for baking about 80 minutes at 150° C., about −84 millivolts for baking about 160 minutes at 150° C., about −84 millivolts for baking about 320 minutes at 150° C., and about −92 millivolts for baking about 640 minutes at 150° C. The amount of charge losses without the retention improvement procedure as shown in column 522 can be significantly larger than the amount of charge losses generated with the retention improvement procedure.

Figure 6:
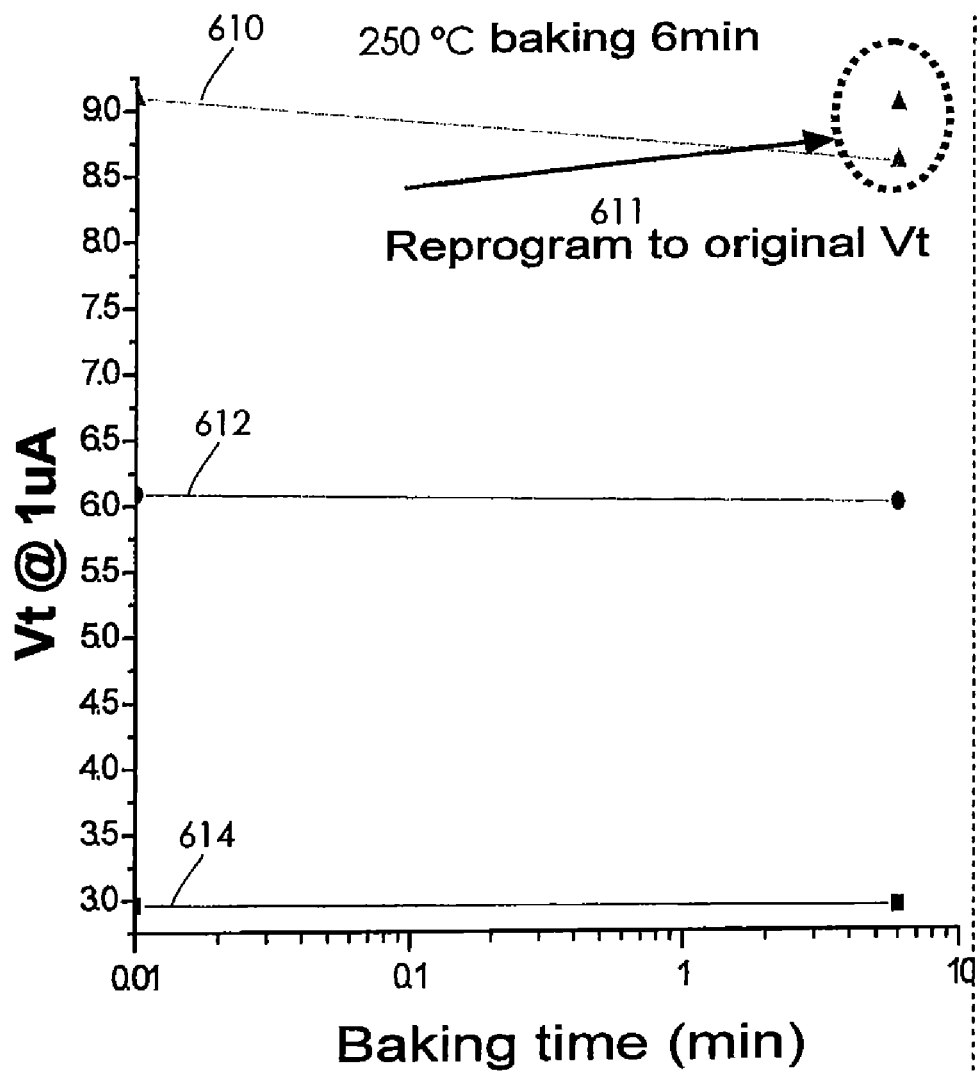
FIG. 6 is a graph illustrating the retention improvement procedure at 250° C. for medium and high voltage threshold states to improve baking charge loss in accordance with the present invention.

FIG. 6 is a graph 600 illustrating the retention improvement procedure (i.e., baking and re-program) at 250° C. for medium and high voltage threshold states to improve baking charge loss. The graph 600 depicts three sample data lines 610, 612 and 614 in which the memory device 100 is baked at 250° C. for about 6 minutes. The data line 610 represents a series of data points in which the program voltage threshold Vt is about 9 volts. The baking charge losses in the data line 610 increase as a function of time. Once the charge loss becomes too large to pass a verification test, then the memory cell 110 is reprogrammed 611 back to about 9 volts. The data line 612 represents a series of data points in which the program voltage threshold Vt is about 6 volts. The baking charge losses in the data line 612 gradually increase as a function of time. The data line 614 represents a series of data points in which the program voltage threshold Vt is about 3 volts. The baking charge losses in the data line 614 may gradually increase as a function of time.

Figure 7A:
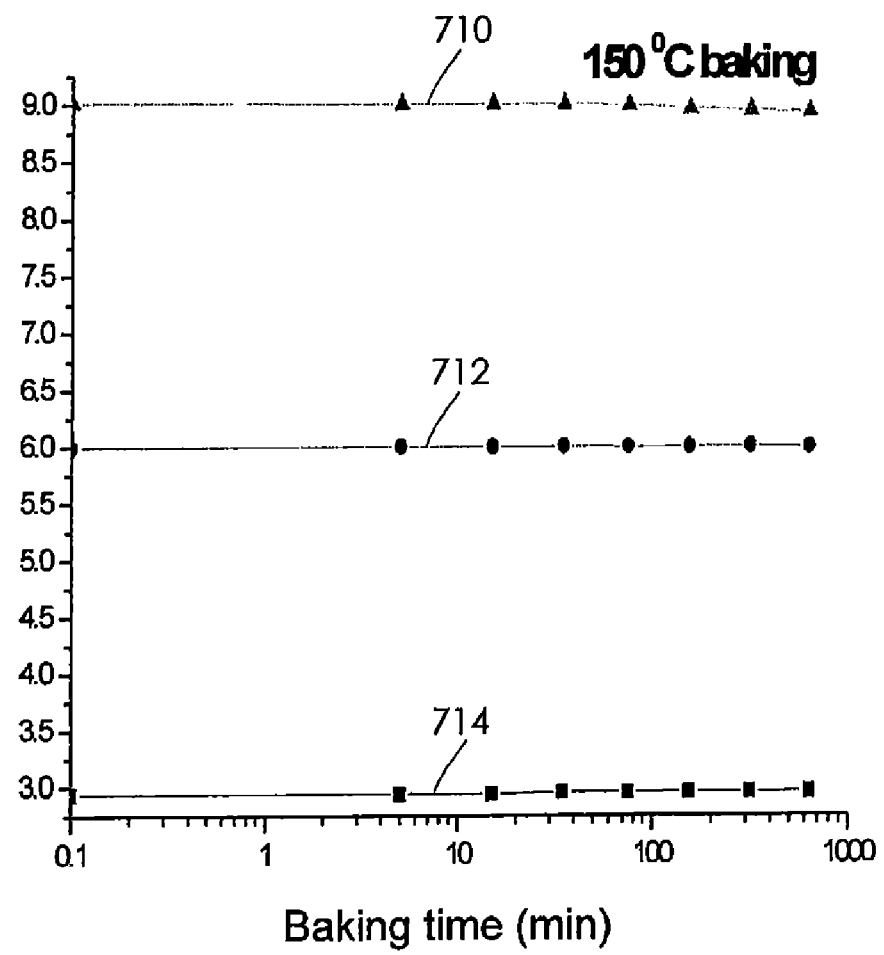
FIG. 7A is a graph illustrating the retention improvement at 150° C. for medium and high voltage threshold states for improving baking charge loss improvement in accordance with the present invention.

FIG. 7A is a graph 700 illustrating the retention improvement at 150° C. for medium and high voltage threshold states for improving baking charge loss improvement.

The graph 700 depicts three sample data lines 710, 712 and 714 in which the memory device 100 is baked at 150° C. The data line 710 represents a series of data points in which the program voltage threshold Vt is about 9 volts. The baking charge losses in the data line 710 gradually increase as a function of time. Sample charge loss data of the memory device 100 that is baked at 150° C. with medium and high voltage threshold Vt states after the retention improvement procedure are shown in FIG. 7B.

As shown in a column 720, the charge loss for the program voltage threshold Vt of about 9 volts is about −16 millivolts for baking about 5 minutes at 150° C., about −18 millivolts for baking about 15 minutes at 150° C., about −19 millivolts for baking about 35 minutes at 150° C., about −28 millivolts for baking about 75 minutes at 150° C., about −59 millivolts for baking about 155 minutes at 150° C., about −77 millivolts for baking about 315 minutes at 150° C., and about −94 millivolts for baking about 635 minutes at 150° C. The amount of charge losses with the retention improvement procedure as shown in column 720 is significantly less than if the amount of charge losses generated by a conventional flow without the retention improvement procedure.

The data line 712 represents a series of data points in which the program voltage threshold Vt is about 6 volts. Sample data results of baking charge loss of the memory device 100 that is baked at 150° C. with medium and high voltage threshold Vt states are shown in FIG. 7B. As shown in a column 722, the charge loss for the program voltage threshold Vt of about 6 volts is about 0 millivolts for various baking measurement times at about 5 minutes, 15 minutes, 35 minutes, 75 minutes, 155 minutes, 315 minutes and 635 minutes. There is literally no charge loss or negligible charge loss using the retention improvement procedure as shown in column 722, in comparison to a conventional flow without the retention improvement procedure which generates a significant amount of charge loss. The amount of charge losses with the retention improvement procedure as shown in column 722 can be significantly less than the amount of charge losses generated by a conventional flow without the retention improvement procedure.

The invention has been described with reference to specific exemplary embodiments. For example, the method in the present invention is applicable to any type or variation of a nitride trapping memory including both N-channel and P-channel SONOS types of devices and floating gate memory. Various modifications, adaptations, and changes may be made without departing from the spirit and scope of the invention. Accordingly, the specification and drawings are to be regarded as illustrative of the principles of this invention rather than restrictive, the invention is defined by the following appended claims.

The invention claimed is:
1. A method for improving retention characteristics of a memory device including a plurality of memory cells, comprising:
 baking the plurality of memory cells at a temperature level for a sufficient duration to cause shallow trapped charges to be expelled from the plurality of memory cells;

after the baking step, verifying the plurality of memory cells to determine if written data in memory cells are unchanged from before the baking step;

if the plurality of memory cells fail the verify step, reprogramming failing memory cells to the high threshold voltage state again; and after the reprogramming step, determining that the number of times that the memory cells have been reprogrammed is equal to or less than N number of times and returning to the baking step.

2. The method of claim 1, further comprising, prior to the baking step, programming the plurality of memory cells by writing data to the plurality of memory cells to the high threshold voltage state.

3. The method of claim 1, wherein the baking step comprises baking the plurality of memory cells at the temperature level of about 150° C. or higher.

4. The method of claim 1, wherein the baking step comprises baking the plurality of memory cells at the temperature level of about 250° C. or higher.

5. The method of claim 1, wherein the plurality of memory cells comprises uncycled memory cells that have not undergone program and erase cycles.

6. A method for improving retention characteristics of a memory device including a plurality of memory cells, comprising:

programming and erasing the plurality of memory cells;

excluding one or more memory cells in the plurality of memory cells that do not pass the programming and erasing steps;

baking the memory cells at a temperature level for a sufficient duration to cause shallow trapped charges to be expelled from the memory cells;

after the baking step, verifying the plurality of memory cells to determine if written data in the memory cells are unchanged from before the baking step;

if the memory cells fail the verify step, reprogramming failed memory cells to the high threshold voltage state; and after the reprogramming step, determining that the number of times that the memory cells have been reprogrammed is equal to or less than N number of times and returning to the baking step.

7. The method of claim 6, further comprising, prior to the baking step, programming the plurality of memory cells by writing data to the plurality of memory cells to the high threshold voltage state.

8. The method of claim 6, wherein the baking step comprises baking the plurality of memory cells at the temperature level of about 150° C. or higher.

9. The method of claim 6, wherein the baking step comprises baking the plurality of memory cells at the temperature level of about 250° C. or higher.

* * * * *